US012618889B2

(12) United States Patent
Kumar et al.

(10) Patent No.: US 12,618,889 B2
(45) Date of Patent: May 5, 2026

(54) METHOD AND ETHERNET PHYSICAL LAYER DEVICE FOR DETECTING, CLASSIFYING AND LOCALIZING CABLE FAULTS OF AN ETHERNET PHYSICAL CABLE, PARTICULARLY AN AUTOMOTIVE ETHERNET PHY, USING A TIME DOMAIN REFLECTOMETRY ALGORITHM

(71) Applicant: SILICONALLY GMBH, Dresden (DE)

(72) Inventors: Dilip Kumar, Hamburg (DE);
Sebastian Höppner, Dresden (DE);
Stephan Hartmann, Coswig (DE);
Emrah Onat, Dresden (DE)

(73) Assignee: SILICONALLY GMBH, Dresden (DE)

( * ) Notice: Subject to any disclaimer, the term of this patent is extended or adjusted under 35 U.S.C. 154(b) by 199 days.

(21) Appl. No.: 18/436,431

(22) Filed: Feb. 8, 2024

(65) Prior Publication Data

US 2024/0272218 A1     Aug. 15, 2024

(30) Foreign Application Priority Data

Feb. 9, 2023     (EP) ..................................... 23155773

(51) Int. Cl.
*G01R 31/11*          (2006.01)
*G01R 31/00*          (2006.01)
(52) U.S. Cl.
CPC ............ *G01R 31/11* (2013.01); *G01R 31/006* (2013.01)
(58) Field of Classification Search
CPC .... G01R 31/08–10; G01R 31/005–008; G01R 31/11; G01R 27/06
See application file for complete search history.

(56) References Cited

U.S. PATENT DOCUMENTS

| 5,461,318 | A | 10/1995 | Borchert et al. |
| 7,164,274 | B2 | 1/2007 | Pharn et al. |
| 7,173,431 | B1 | 2/2007 | Lo et al. |
| 7,679,371 | B1 | 3/2010 | Lo |
| 8,013,614 | B2 | 9/2011 | Diab |
| 9,103,869 | B2 | 8/2015 | Breed et al. |

(Continued)

FOREIGN PATENT DOCUMENTS

GB          2496121 A       8/2013

OTHER PUBLICATIONS

Layane Abbound, "Time Reversal techniques applied to wire fault detection and location in wire networks," Supélec, 2012, English, NNT: 2012SUPL0002ff, tel-00771964.

(Continued)

*Primary Examiner* — Lee E Rodak
*Assistant Examiner* — Demetrius R Pretlow
(74) *Attorney, Agent, or Firm* — Nicholas Mesiti, Esq.; Heslin Rothenberg Farley & Mesiti P.C.

(57)          ABSTRACT

The invention relates to a method and ethernet physical layer device for detecting, classifying and localizing cable faults of an ethernet physical cable, particularly an automotive ethernet PHY, using a time domain reflectometry algorithm, using a hybrid mode for selectively subtracting sent signals from received signals for fault detection and classification and considering send and received signals during fault localization.

20 Claims, 8 Drawing Sheets

(56) References Cited

U.S. PATENT DOCUMENTS

Figure 1:
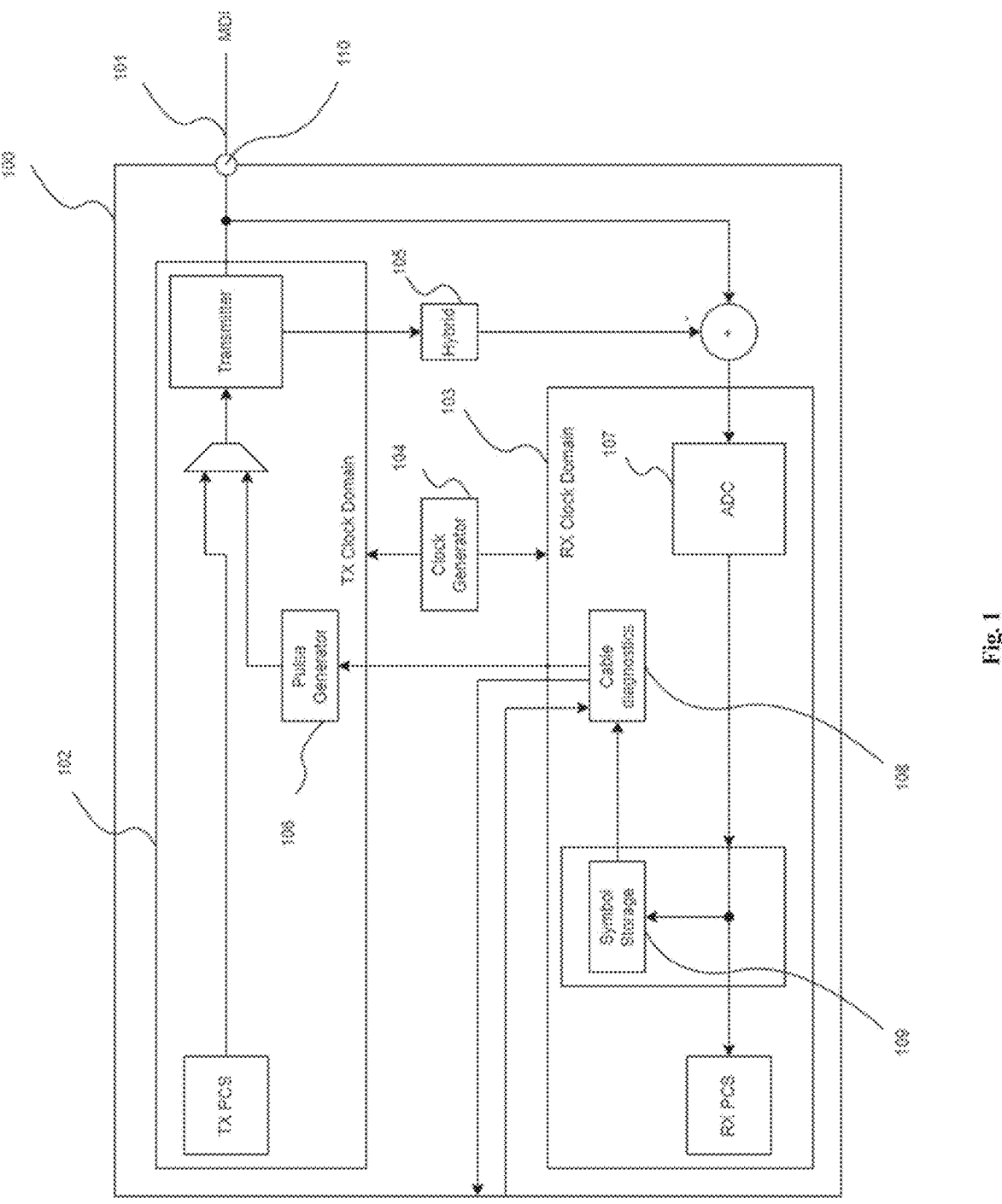

| | | | |
|---|---|---|---|
| 10,091,053 | B2 | 10/2018 | Chini et al. |
| 2004/0251912 | A1 | 12/2004 | Pharn et al. |
| 2021/0231725 | A1* | 7/2021 | Whitehouse .......... G01R 31/11 |
| 2023/0318990 | A1* | 10/2023 | Calciu ................ H04L 49/3054 |
| | | | 709/224 |

OTHER PUBLICATIONS

C. Furse et al., "Frequency-domain reflectometry for on-board testing of aging aircraft wiring," IEEE Transactions on Electromagnetic Compatibility 45.2 (2003), pp. 306-315.

Chet Lo et al., "Noise-domain reflectometry for locating wiring faults," IEEE Transactions on Electromagnetic Compatibility, vol. 47, No. 1, pp. 97-104, Feb. 2005.

N. K. T. Jayakumar et al., "Postprocessing for Improved Accuracy and Resolution of Spread Spectrum Time-Domain Reflectometry," IEEE Sensors Letters, vol. 3, No. 6, pp. 1-4, Jun. 2019, Art No. 1500204.

E. Cabanillas et al., "On the Implementation of Embedded Communication over Reflectometry-oriented Hardware for Distributed Diagnosis in Complex Wiring Networks," 2018 IEEE Autotestcon, 2018, pp. 1-6.

Q. Shi et al., "Detection and localization of cable faults by time and frequency domain measurements," 2010 7th International Multi-Conference on Systems, Signals and Devices, 2010, pp. 1-6.

M. Ramphal et al., "Using the Time Domain Reflectometer to Check for and Locate a Fault," Candu Maintenance Conference 1995.

* cited by examiner

METHOD AND ETHERNET PHYSICAL LAYER DEVICE FOR DETECTING, CLASSIFYING AND LOCALIZING CABLE FAULTS OF AN ETHERNET PHYSICAL CABLE, PARTICULARLY AN AUTOMOTIVE ETHERNET PHY, USING A TIME DOMAIN REFLECTOMETRY ALGORITHM

CROSS REFERENCE TO RELATED APPLICATIONS

This application is the U.S. Patent Application which claims priority to European Application No.: 23155773.7, filed on Feb. 9, 2023. The contents of this prior application is hereby incorporated by reference herein in its entirety.

The invention relates to a method for detecting, classifying and localizing cable faults of an ethernet physical cable, particularly an automotive ethernet PHY, using a time domain reflectometry algorithm. The invention further relates to an ethernet physical layer device capable of detecting, classifying and localizing cable faults of an ethernet physical cable using a time domain reflectometry algorithm.

BACKGROUND

This invention refers to the technical field of automotive ethernet cable diagnostics. To ensure reliability and functional safety, automotive ethernet PHYs require cable diagnostics which include functionalities to detect, to classify and to locate faults of the physical cable with low hardware effort. The faults are for example an open or a short.

With the advent of the technology, there have been different techniques in order to detect the faults and then estimate of its location on the cable. The most popular methods used nowadays are visual and radiographic inspections, low frequency and DC methods, capacitive and inductive methods, medium frequency techniques like tone injection, RF radiation, impedance spectroscopy, Reflectometry etc. (see Layane Abboud, Time Reversal techniques applied to wire fault detection and location in wire networks, Supélec, 2012, English, NNT: 2012SUPL0002ff, tel-00771964). Nevertheless, most of the methods have some disadvantages. The major drawback of visual and radiographic inspections is that they require human interventions. So, these techniques cannot be applied to cables that are not easy to access. The low frequency, capacitive and inductive methods need cables to be disconnected from the circuit which is not feasible for automotive ethernet PHY architecture. Unlike the automotive ethernet standards, shielded twisted pair (STP) wires have required in medium frequency techniques like tone injection and RF radiation for higher accuracies. Moreover, Spectroscopy techniques require the analysis of frequency dependent impedance data which needs high hardware effort. All things considered, reflectometry is the best and most common method to detect and localize the fault, with respect to hardware effort and suitability of the ethernet PHY architecture.

In reflectometry technique, a high-frequency signal is transmitted over the cable for analysis. If there is a fault on the cable, the transmitted signal will be reflected back with beneficial information about the fault. It basically uses the voltage reflection coefficient and can be used for different types of cables from telecom networks to aircraft cables.

There are several Reflectometry techniques which differ in transmitted signal and algorithms for detection and localization of the fault on the cable. On one hand, there are some complex reflectometry algorithms such as Frequency Domain Reflectometry (FDR), Noise Domain Reflectometry (NDR), Sequence Time Domain Reflectometry (STDR), Spread Spectrum Time Domain Reflectometry (SSTDR), Orthogonal Multi-tone Time Domain Reflectometry (OMTDR), Chaos Time Domain Reflectometry (CTDR), Binary Time Domain Reflectometry (BTDR). Stepped frequency sine waves are used as transmitted signal in FDR. It needs Frequency Modulated Continuous Wave (FMCW) to change or shift in frequency of the signal and it requires phase detection block to detect faults (see C. Furse, Y. C. Chung, R. Dangol, M. Nielsen, G. Mabey, and R. Woodward. "Frequency-domain reflectometry for on-board testing of aging aircraft wiring". In: *IEEE Transactions on Electromagnetic Compatibility* 45.2 (2003), pp. 306-315. doi: 10.1109/TEMC.2003.811305.). NDR uses the already existing data or existing noise data as a transmitted signal (see Chet Lo and C. Furse, "Noise-domain reflectometry for locating wiring faults," in *IEEE Transactions on Electromagnetic Compatibility*, vol. 47, no. 1, pp. 97-104, February 2005, doi: 10.1109/TEMC.2004.842109.). Similarly, STDR and SSTDR techniques use Pseudo Noise (PN) as the transmitted signal and the reflected signal is correlated with the template signal to analyze the fault (see N. K. T. Jayakumar et al., "Postprocessing for Improved Accuracy and Resolution of Spread Spectrum Time-Domain Reflectometry," in IEEE Sensors Letters, vol. 3, no. 6, pp. 1-4, June 2019, Art no. 1500204, doi: 10.1109/LSENS.2019.2916636.). OMTDR works based on the principle of orthogonal frequency division multiplexing (OFDM). The transmitted signal is generated using Hermitian symmetry. Reflectogram is generated by performing cross-correlation operation between the transmitted and reflected signal. A lot of hardware effort is required for OMTDR (see E. Cabanillas, M. Kafal and W. Ben-Hassen, "On the Implementation of Embedded Communication over Reflectometry-oriented Hardware for Distributed Diagnosis in Complex Wiring Networks," 2018 IEEE AUTOTEST-CON, 2018, pp. 1-6, doi: 10.1109/AUTEST.2018.8532560.). On the other hand, a simple Time Domain Reflectometry (TDR) uses a short pulse or step as the transmitted signal and reflected signal is analyzed in time domain (see Q. Shi, U. Troeltzsch and O. Kanoun, "Detection and localization of cable faults by time and frequency domain measurements," 2010 *7th International Multi-Conference on Systems, Signals and Devices*, 2010, pp. 1-6, doi: 10.1109/SSD.2010.5585506.). It is widely accepted that complex algorithms can generate better results. However, there are still a lot of drawbacks in terms of hardware complexity. For this reason, Time Domain Reflectometry is the better and simplest option to detect and localize the fault with high rate.

From the prior art it is known to use Time Domain Reflectometry (TDR) in cable diagnostics for detection, classification and localization of faults of the physical cable. TDR relies on a precise knowledge of the timing between sender TX and receiver RX. In practical circuit implementations, TX and RX might be clocked at different clock domains and thereby are decoupled with a FIFO. This introduces an uncertainty for timing.

There are some approaches which uses TDR technique for cable diagnostics. However, existing solutions rely on a synchronous design of the transmitter and the receiver for time domain reflectometry.

U.S. Pat. No. 9,103,869 B2 discloses a cable diagnostic for BASE-T systems, which can be used to measure cable length and detect faults. A finite duration pulse along with the principle of TDR has been used for cable diagnostics. The data is processed using the difference method which calculates the slope of the signal and then a threshold is used for fault detection and classification. The fault location is estimated using the number of samples between transmitted and reflected signal. Fault localization would be difficult when the hybrid circuit according to the present invention is on if the transmitter and receiver are asynchronous. For this reason, according to the present invention, hybrid off mode is used to localize the fault.

U.S. Pat. No. 7,173,431 B1 discloses a virtual cable tester, which uses a lookup table (LUT) for comparison of sampled data. TDR and peak detection have been used for fault classification and location estimation. It includes a pretest module which is done before actually starting diagnostics. This mechanism needs a lookup table for cable length that includes a set of reflection amplitudes as a function of cable length. It occupies more area in the system. Additionally, as the lookup table values depend on fixed conditions, erroneous cases will increase with different SNR levels.

U.S. Pat. No. 8,013,614 B2 discloses that a cable length can be determined by using the link delay measurements. These measurements are based on clock synchronization between nodes in a network. Overall accuracy can be improved by combining the two cable length delay measurements into a final estimate, despite the accuracy issues of these measurements. This mechanism synchronizes the sender and receiver part by transmitting a frame including time stamp. For this reason, it cannot work in asynchronous transmitter and receiver properly since there is no clock in common.

U.S. Pat. No. 10,091,053 B2 discloses a method that can be used for measuring echo responses of communication links used in in-vehicle networks with high resolution and high dynamic range. They allow for diagnostics of various failures and/or degradations with high precision. All estimated impulse responses are combined, and it has a comparatively higher resolution than any of the individual impulse responses. The main purpose of this mechanism is to improve the resolution of impulse response by combining the multiple impulse responses. Besides, it needs to store the impulse response of the channel over which the echo is received under normal operation to compare the high-resolution impulse response of faulty cases.

U.S. Pat. No. 7,679,371 B1 is based on a method that incrementally increases the predetermined time period during the iterations of a cable test in order to verify a predetermined segment of the cable. This mechanism needs synchronous sender and receiver parts, and it requires more iterations for longer cables and higher resolutions in localization.

U.S. Pat. No. 7,164,274 B2 is based on a method that compares the characteristics of the reflected signal and the transmitted wave or other values used in a TDR system. Known type of wave is used as a transmitted signal and parameters associated with the reflected wave are used for comparison in order to detect short or open faults. This mechanism does not include Hybrid mode according to the present invention, therefore pulse cancels itself when the fault is located on the border of near end. For this reason, this mechanism uses two different pulses with different duration and magnitudes. So, it results more complex analysis of received data. Besides, there is no mechanism for localization in this prior art.

GB2496121A discloses that a sinc stimulus pulse is applied to the network as a calibration and reflected signal (echo) is stored as a reference. Peaks within the received echo are detected and it has to be repeated many times. And final peak location has to be selected as the fault may be on the basis of the highest scoring peak index. This mechanism uses sinc pulses for detection and localization of fault on the cable and it requires more hardware effort as it has to store fault-free impulse response for comparison. Additionally, it needs several iterations to find the correct peak location.

It is an object of the present invention to provide fault detection, fault classification and fault localization for an ethernet physical cable when the exact clock phase relation between transmitter and receiver is not known.

SUMMARY OF THE INVENTION

The object is solved according to the invention by a method for detecting, classifying and localizing cable faults of an ethernet physical cable, particularly an automotive ethernet PHY, using a time domain reflectometry algorithm, comprising the steps:

sending through a transmitter a first finite duration diagnosis pulse signal to the ethernet cable, receiving by a receiver first reflection from the ethernet cable in response to the first diagnosis pulse signal, extracting a first reflected signal by subtracting the send first diagnosis pulse signal from the received first reflection, detecting a fault of the ethernet cable by comparing the first reflected signal to a predetermined threshold, wherein a fault of the ethernet cable is detected if the first reflected signal exceeds the predetermined threshold classifying the type of fault of the detected fault based on the polarity of the first reflected signal, wherein the fault is an open if the first reflected signal is positive and a short if the first reflected signal is negative, sending through the transmitter a second finite duration diagnosis pulse signal to the ethernet cable, receiving by the receiver second reflection from the ethernet cable in response to the second diagnosis pulse signal, extracting a second reflected signal comprising the send second diagnosis pulse signal and the received second reflection, detecting a first peak in the second reflected signal relating to the send second diagnosis pulse and a second peak in the second reflected signal relating to the received second reflection, and localizing the detected fault of the ethernet cable by determining the time difference between the detected first peak and the detected second peak.

The method according to the present invention uses a novel time domain reflectometry algorithm for detecting, classifying and localizing cable faults of an ethernet physical cable, particularly an automotive ethernet PHY. In a first step of this algorithm a first finite duration diagnosis pulse signal is sent by a transmitter to the ethernet cable. A receiver receives first reflection from the ethernet cable in response to the first diagnosis pulse signal. From this received first reflection the send first diagnosis pulse signal is subtracted to obtain a first reflected signal. This obtained first reflected signal is compared to a predetermined threshold to detect a fault of the ethernet cable. A fault of the ethernet cable is detected if the first reflected signal exceeds the predetermined threshold. The polarity of the first reflected signals depends on the type, i.e. open or short. An open fault results in a positive first reflected signal and a short fault results in a negative first reflected signal. Thus, the type of fault can be classified based on the polarity of the first reflected signal.

Next, particularly if a fault has been detected, a second finite duration diagnosis pulse is sent by the transmitter to the ethernet cable. The receiver receives second reflection from the ethernet cable in response to the second diagnosis pulse signal. A second reflected signal is obtained, which comprises the send second diagnosis pulse signal and the received second reflection. Thus, this time the sent second diagnosis pulse signal is not subtracted from the received second reflection, but also part of the obtained second reflected signal. Therefore, the second reflected signal comprises a first peak relating to the send second diagnosis pulse and a second peak relating to the received second reflection. The first peak and second peak are detected according to the inventive method. The location of the detected fault of the ethernet cable can be determined based on the time difference between the detected first peak and the detected second peak.

The first peak is detected and that time is marked as first peak time (P1). Likewise, second peak is detected and that time is marked as second peak time (P2). If two peaks detected in both fault types (open or short), it means that the reflected signal due to the fault and transmitted signal are separated from each other and open or short faults occurs at far end location. Fault location can be estimated by determining the interval between the two peaks (P2–P1). Nevertheless, if interval between the two peak indexes is lower than pulse width (PW), location can be estimated by using time points when the second received signal exceeds the predetermined threshold (S) and afterwards falls below the predetermined threshold (L), particularly based on the following formula: L–S–2×PW+1. It means that the reflected signal due to fault and transmitted signal are adjacent/close to each other. If just one peak is detected, it means that the reflection due to fault and transmitted signal overlap on each other. And the location of fault is near end of the cable. The location can be estimated as similar as adjacent scenario. Finally, if any peak cannot be detected, it means the fault location is directly assigned to zero.

According to a variant of the invention the transmitter and the receiver are clocked by different clock signals from one clock generator. Thus, the clock signals of the transmitter and the receiver have the same frequency but can have different phase.

In a variant of the invention a matched filtering is used for generating a filter response as an input for comparing with the predetermined threshold. The decision about faulty is made at the output of the matched filter by comparing the magnitude against the predetermined threshold.

Pursuant to a further variant of the invention the predetermined threshold is defined by experiments. In order to have high probability of detection, low false alarm rate and high classification and localization accuracy, threshold value has to be defined optimally. Thus, threshold value plays an important role for fault detection, classification and localization. An optimal threshold value can be defined using experiments, wherein the experiments consider the most relevant factors influencing fault detection, classification and localization.

According to an advantageous variant of the invention the experiments refer to different fault types and/or different cables length.

In another variant of the invention the experiments also consider data of a non-faulty ethernet cable and/or random noise.

Pursuant to a variant of the invention the method further the comprises the step of performing a pretest analysis of the ethernet link for detecting if the present noise level on the ethernet channel is above a given threshold. In this variant of the invention the method starts with performing a pretest analysis of the ethernet link based on ethernet data traffic. During the pretest the variance of received data is calculated in order to decide whether the received data is too noisy or not. This is done by comparing the calculated variance with a pretest threshold value. If the calculated variance value is higher than the predefined threshold value, it means that channel has so much noise and the method has to be terminated. If not, the method can continue as described above.

According to preferred variant of the invention the step of detecting a first peak in the second reflected signal relating to the send second diagnosis pulse and a second peak in the second reflected signal relating to the received second reflection bases on the predefined threshold value of the fault detection step to detect the first peak and the second peak. Thus, the predetermined threshold used to detect whether a fault is present on the ethernet link or not is reused to detect the first peak and second peak in the second reflected signal. If the predetermined threshold is suitable for detected the presence of a fault, it is also suitable for detecting the first peak and second peak.

In an advantageous variant of the invention the predetermined threshold value for detecting the first peak is positive and for detecting the second peak the threshold value is positive for an open fault and negative for a short fault.

Pursuant to a variant of the invention the method is implemented in software of an ethernet controller.

The object is further solved by an ethernet physical layer device capable of detecting, classifying and localizing cable faults of an ethernet physical cable using a time domain reflectometry algorithm comprising:

a media port for connecting to the ethernet physical cable, a transmitter circuit for transmitting signals over the ethernet physical cable, a receiver circuit for receiving signals from the ethernet physical cable, a clock generator for providing different clock signals to the transmitter circuit and receiver circuit, wherein the different clock signals preferably have the same frequency and different phases, a hybrid circuit for subtracting send transmitter signals from received receiver signals, wherein the hybrid circuit can be switched on and off, a programmable pulse generator for generating a first finite duration diagnosis pulse and/or a second finite duration diagnosis pulse, and an ethernet physical cable diagnostic controller for implementing the method according to the invention.

The ethernet physical layer device is attached to a media dependent interface cable. It further comprises the transmitter circuit and the receiver circuit, which are clocked by different clock signals from one clock generator. These two clock signals can have different phases but the same frequency. The transmitter circuit and the receiver circuit are connected to the media dependent interface cable. They are further connected via the hybrid circuit, which subtracts the currently send transmitter symbol from the currently received symbol. The hybrid circuit can be switched on and off.

For means of cable diagnostics the transmitter circuit contains a programmable pulse generator, which generates stimulus pulses for time domain reflectometry, particularly a first finite duration diagnosis pulse and/or a second finite duration diagnosis pulse. It is triggered e.g. by a cable diagnostics controller.

According to a variant of the invention the receiver circuit comprises an analog-to-digital converter for converting the received receiver signals to the digital domain. Its sampling clock is derived from the receiver clock domain signal and can be differ in phase from the transmitter clock signal. The sampling clock frequency for cable diagnostics typically is at the baud rate of the ethernet physical layer device.

In a variant of the invention the clock generator generates clock signals a frequency corresponding to the baud rate of the ethernet physical layer device.

Pursuant to another variant of the invention the ethernet physical layer device further comprises a memory for storing received receiver signals.

According to an advantageous variant of the invention the memory corresponds to existing data registers used during data transfer via the ethernet physical cable.

The invention generally relates to a method and ethernet physical layer device for detecting, classifying and localizing cable faults of an ethernet physical cable, particularly an automotive ethernet PHY, using a time domain reflectometry algorithm, using a hybrid mode for selectively subtracting sent signals from received signals for fault detection and classification and considering send and received signals during fault localization.

BRIEF DESCRIPTION OF THE DRAWING FIGURES

Figure 2:
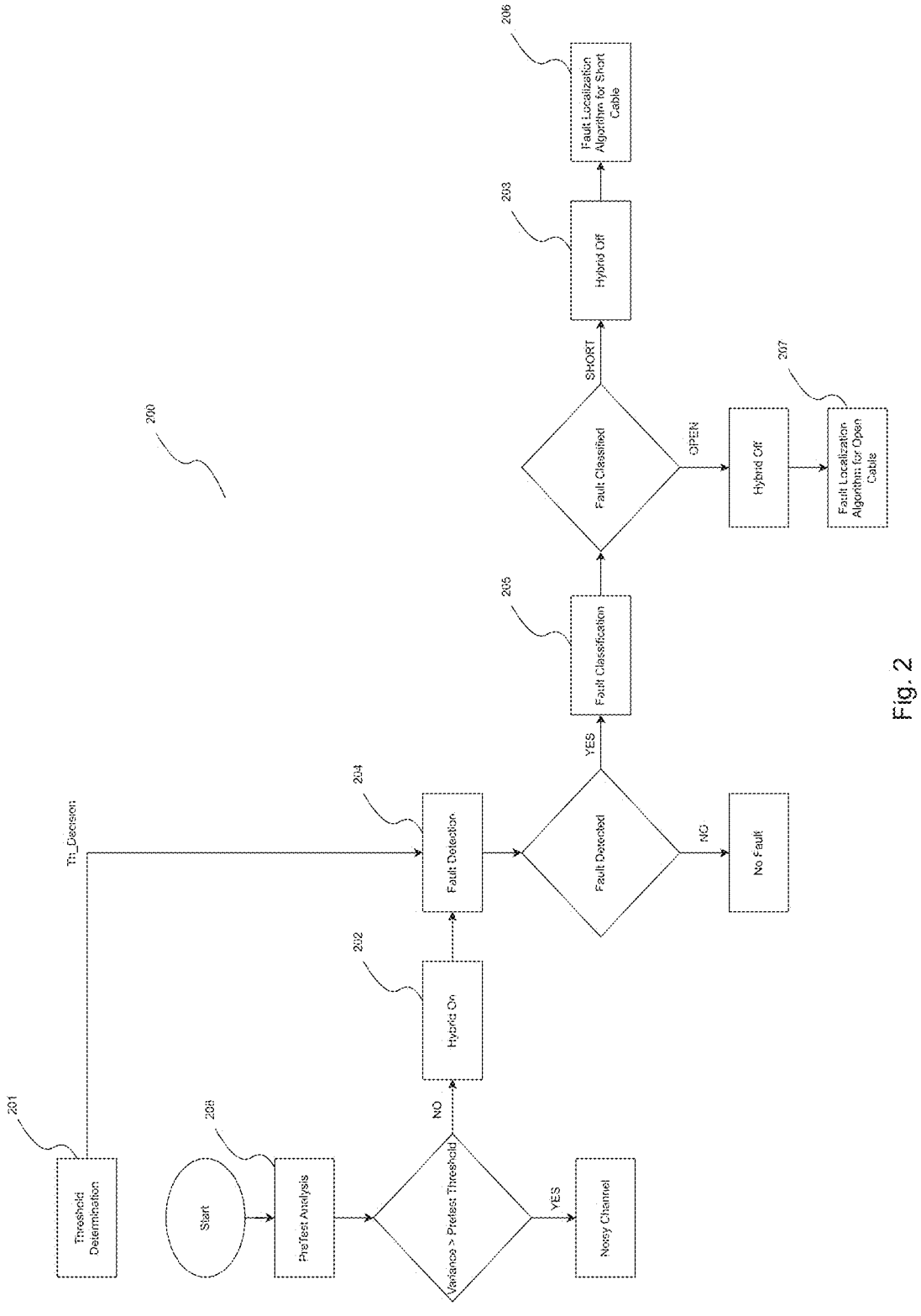
Figure 3:
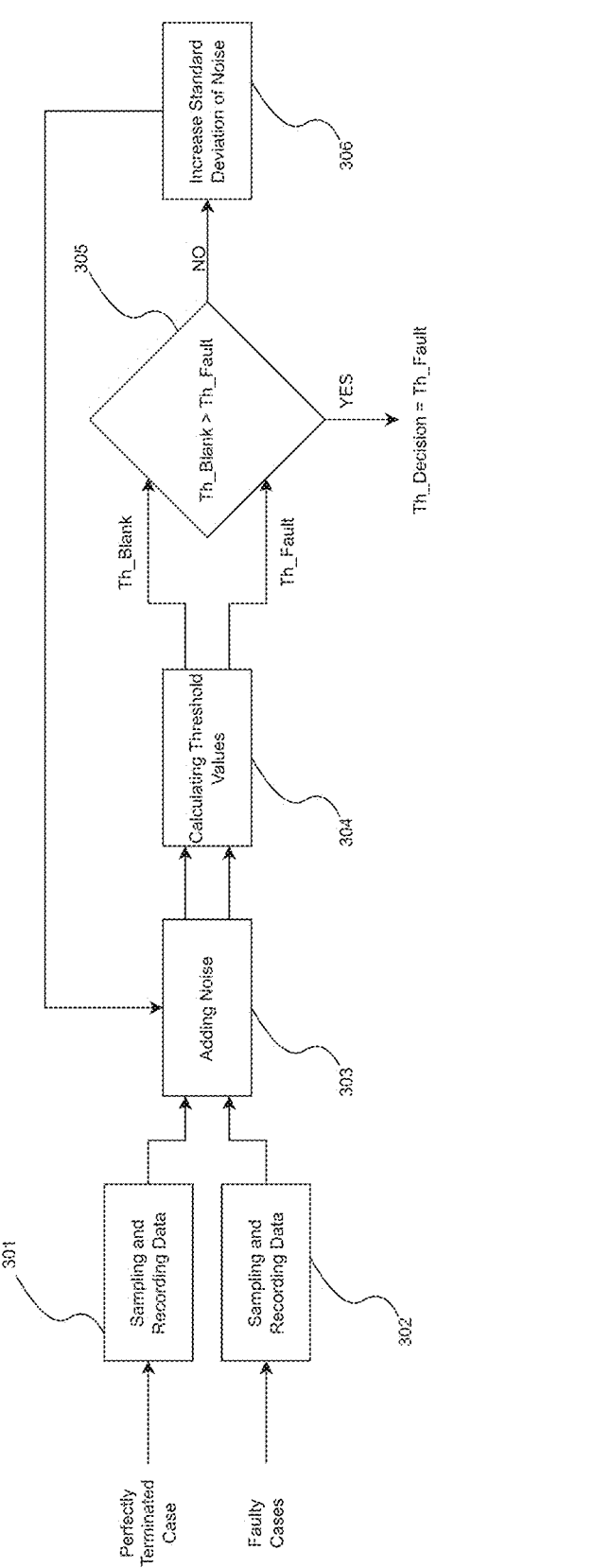
Figure 4:
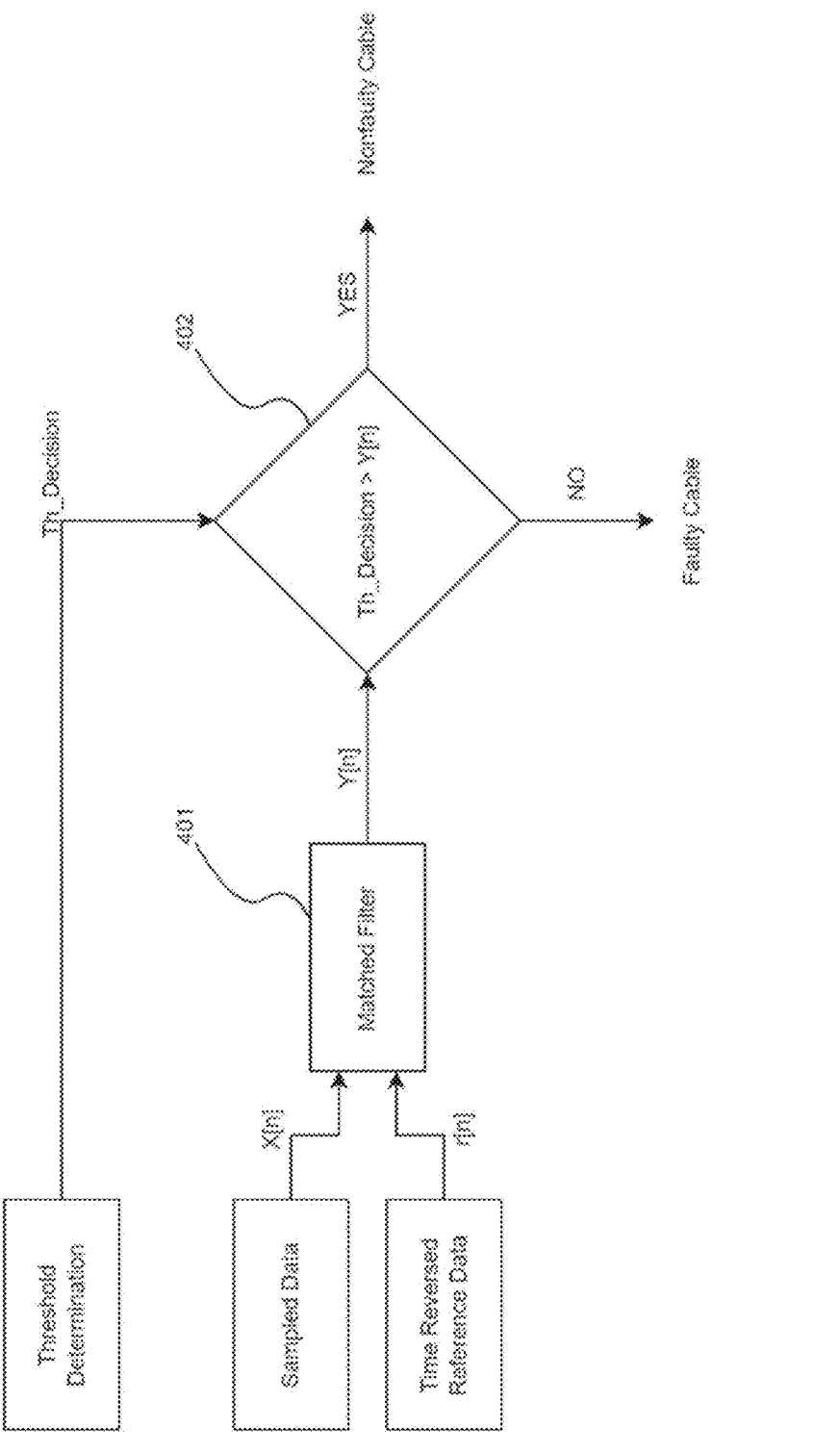
Figure 5:
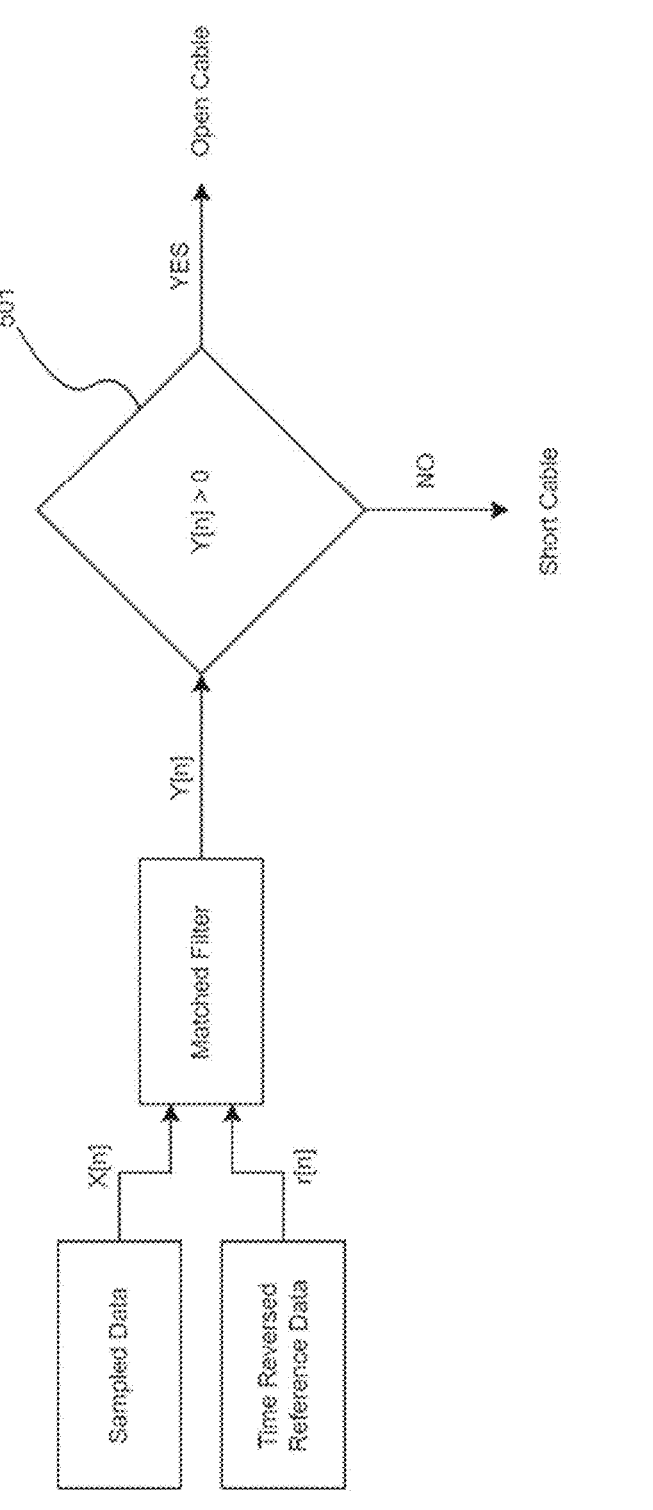
Figure 6:
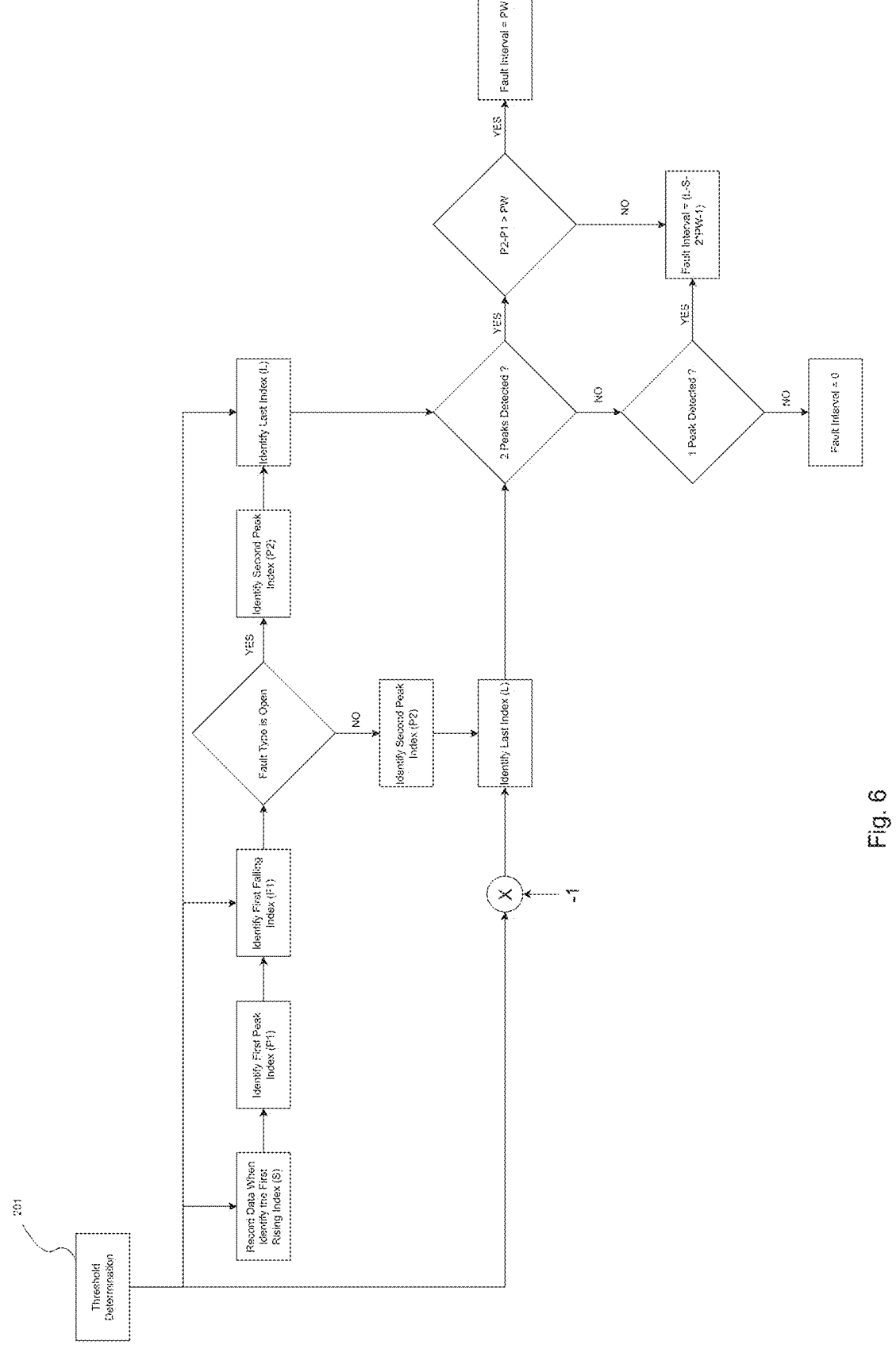
Figure 7:
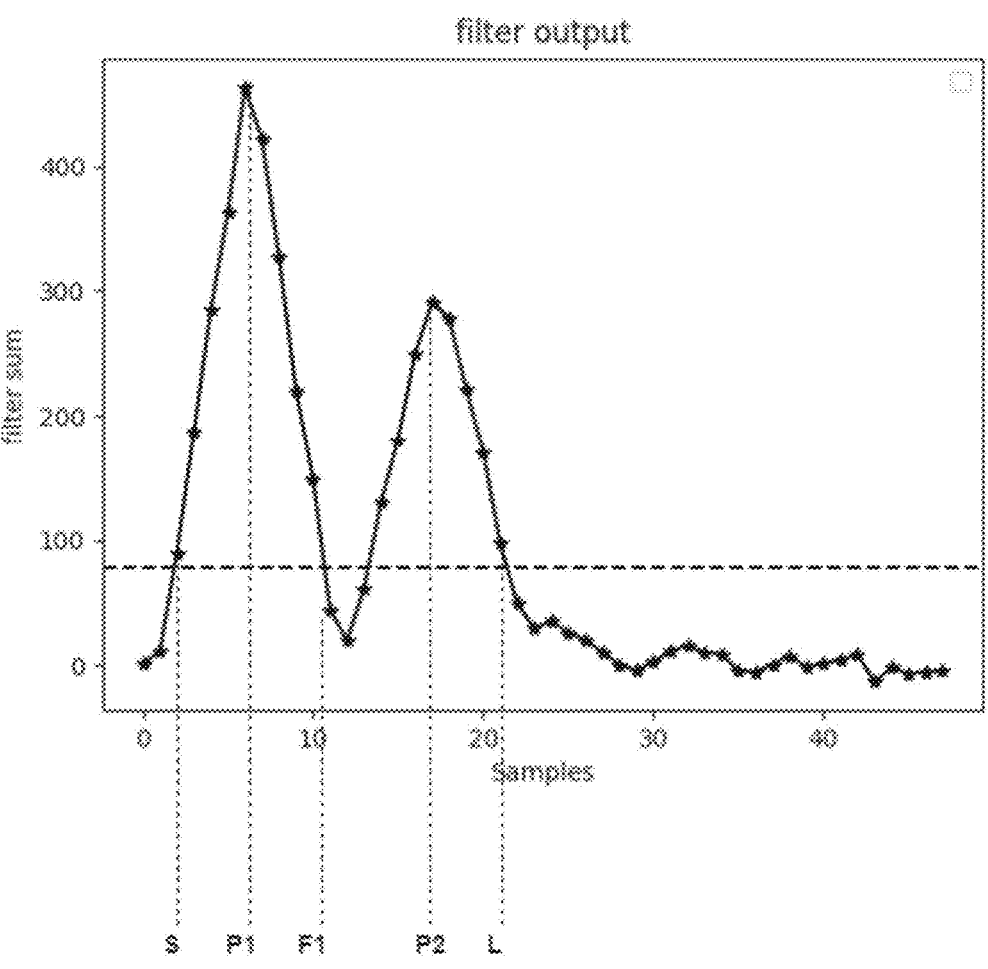
Figure 8:
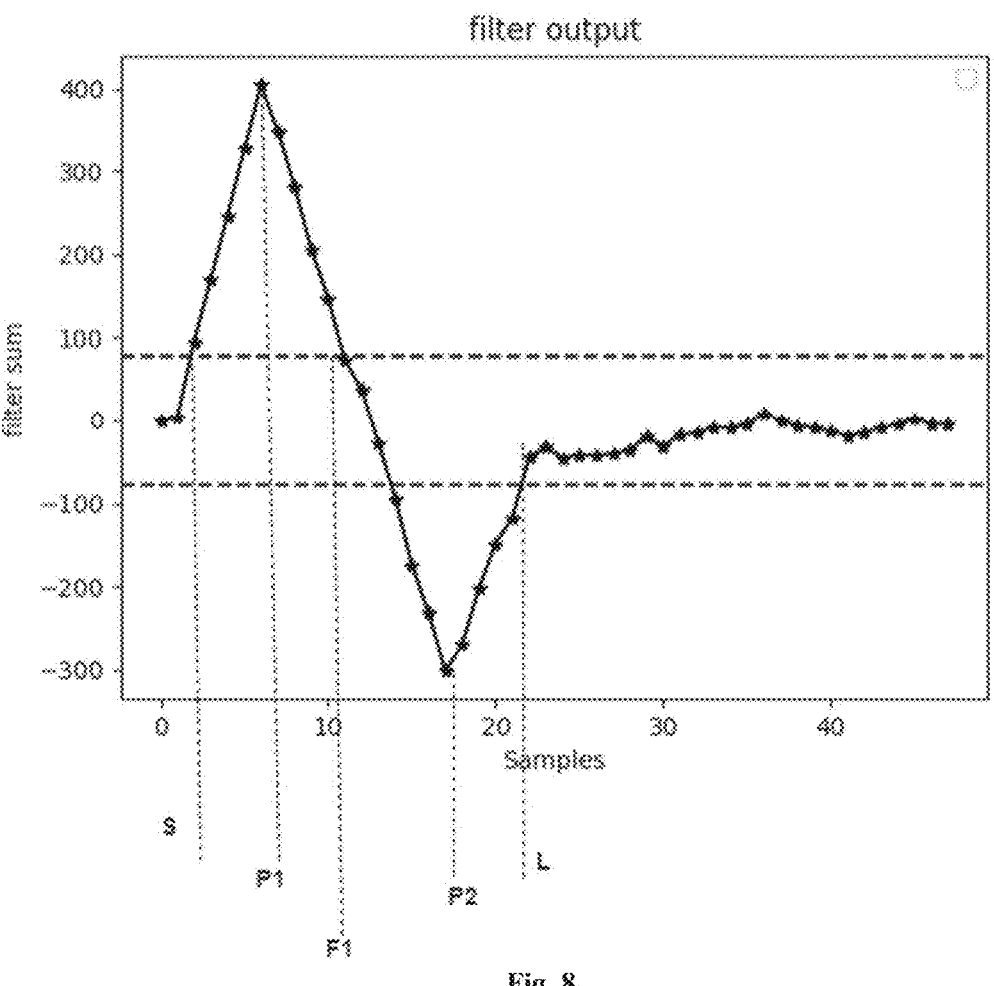

In the following the invention will be further explained with reference to the embodiments shown in the figures. It shows:

FIG. 1 a block diagram of an ethernet physical layer device according to the present invention, FIG. 2 a flow diagram of a method for detecting, classifying and localizing cable faults of an ethernet physical cable according to the present invention, FIG. 3 a flow diagram of a method for calculating the predetermined threshold used in the method according to the present invention, FIG. 4 a flow diagram of the step of the method according to the present invention for detecting a fault of the ethernet cable, FIG. 5 a flow diagram of the step of the method according to the present invention for classifying the type of fault of the detected fault, FIG. 6 a flow diagram of the step of the method according to the present invention for localizing the detected fault, FIG. 7 a signal diagram used for fault localization of a fault of the open type, and FIG. 8 a signal diagram used for fault localization of a fault of the short type.

DETAILED DESCRIPTION

FIG. 1 shows a block diagram of an ethernet physical layer device 100 capable of detecting, classifying and localizing cable faults of an ethernet physical cable 101 using a time domain reflectometry algorithm. The ethernet physical layer device 100 is attached to the ethernet physical cable, which is usually media dependent. Usually, the ethernet physical layer device 100 comprises a media port 110 for connecting the ethernet physical layer cable 101.

The ethernet physical device further comprises a transmitter circuit 102 for transmitting signals over the ethernet physical cable 101 and a receiver circuit 103 for receiving signals from the ethernet physical cable 101.

A clock generator 104 of the ethernet physical layer device 100 provides different clock signals to the transmitter circuit 102 and receiver circuit 103. The different clock signals preferably have the same frequency and different phases.

The transmitter circuit 102 and the receiver circuit 103 are connected to the ethernet physical cable 101 via media port 110. They are further connected to a hybrid circuit 105 of the ethernet physical layer device 100. The hybrid circuit 105 can subtract send transmitter signals from received receiver signals. The hybrid circuit 105 can be switched on and off.

For means of cable diagnostics, the ethernet physical layer device 100, particularly the transmitter circuit 101, contains a programmable pulse generator 106 for generating a first finite duration diagnosis pulse and/or a second finite duration diagnosis pulse. These generated stimulus pulses are used for time domain reflectometry. The pulse generator 106 is triggered by an ethernet physical cable diagnostic controller 108.

The receiver circuit 103 comprises an analog-to-digital converter 107 for converting the received receiver signals to the digital domain. The sampling clock of the analog-to-digital converter 107 is preferably derived from the receiver clock domain signal and can hence differ in phase from the transmitter clock signal. The sampling clock frequency for cable diagnostic typically is at the baud rate of the ethernet physical layer device 100.

During cable diagnostic mode, a continuous stream of analog-to digital-converter 107 samples, i.e. received receiver signals after conversion, is stored in a symbol storage memory 109. This memory 109 can be realized as data registers as part of the receiver circuit filter blocks and thereby re-use existing registers from mission mode of the ethernet physical layer device 100, as for example the digital echo canceller or the digital receiver filter. The storage of the received analog-to-digital converter 107 samples is triggered by cable diagnostics controller 108 and the stored symbols are provided to the cable diagnostics controller 108. The cable diagnostics controller 108 implements algorithms for detection, classification and localization of cable fault in hardware or provides the stored data for external processing by software.

This architecture can be used for executing the following method 200 for detecting, classifying and localizing cable faults of an ethernet physical cable, particularly an automotive ethernet PHY, using a time domain reflectometry algorithm according to the present invention, which is shown in FIG. 2 in more detail.

In a first part of the inventive method 200 for detecting, classifying and localizing cable faults of an ethernet physical cable, particularly an automotive ethernet PHY, using a time domain reflectometry algorithm a cable fault is detected 204 and classified 205. During the detection 204 and classification 205 of cable faults by means of time domain reflectometry using the ethernet physical device 100 of FIG. 1 the hybrid circuit 105 is switched 202 to on state.

The transmitter 102 sends a first finite duration diagnosis pulse signal to the ethernet cable 101. Reflections of the ethernet cable 101 in response to the first diagnosis pulse signal are received by the receiver 103 as first reflections and are stored in the symbol storage memory 109 after a conversion from the analog domain to the digital domain. The direct transmitted signal, i.e. the first finite duration diagnosis pulse signal is subtracted from the line signal, i.e. the first reflections, by the hybrid circuit 105 before the conversion from the time domain to the digital domain. With the help of a matched filter, the fault can be detected by extracting the reflected signal firstly and comparing against a predefined threshold value for detection and classification (e.g., open, short, none).

In a second part of the inventive method 200 for detecting, classifying and localizing cable faults of an ethernet physical cable, particularly an automotive ethernet PHY, using a time domain reflectometry algorithm the detected 204 and classified 205 cable fault is localized 206, 207. During the localization of the cable fault the hybrid circuit 105 is switched 203 to off state.

The transmitter 102 sends a second finite duration diagnosis pulse signal to the ethernet cable 101. Reflections of the ethernet cable 101 in response to the second diagnosis pulse signal are received by the receiver 103 as second reflections and are stored in the symbol storage memory 109 after a conversion from the time domain to the digital domain. Since the hybrid circuit 105 is in off state, the direct transmitted signal, i.e. the second finite duration diagnosis pulse signal is not subtracted from the line signal, i.e. the second reflections. Thus, the receiver 103 records the cable response including the transmitted pulse to the symbol storage 109. From this, the unknown clock phase relation between the transmitter and receiver gets visible in the received data. By means of the proposed method 200 a localization of the fault is executed.

In order to have high probability of detection, low false alarm rate and high classification and localization accuracy, the predetermined threshold value has to be defined optimally. For this reason, threshold value plays an important role for fault detection, classification and localization. Choosing a threshold value for a specific cable length is described in threshold determination 201 step. FIG. 3 shows an example of a flow diagram of a method for calculating 201 the predetermined threshold used in the method 200 according to the present invention.

It has to be selected a specific Ethernet cable length from different alternatives (1 m, 5 m, 10 m, 15 m). It should be chosen longest one to decrease the threshold determination 201 effort. So, the measurements have to be done for fault cases (both open and short) at 15 m and also the measurement should be done with a perfectly terminated cable of length 15 m. The data have to be recorded for cable length 15 m as the attenuation will be maximum. It should be the worst case. So that the calculated threshold will work on all other locations. Then data has to be sampled from the cable for perfectly terminated case in order to get the blank signal 301 and data recording procedure has to be repeated again for open and short cases to get the fault signal 302. Then random noise with particular standard deviation has to be added on recorded blank and fault signals for many iterations 303. Afterwards, thresholds for blank and fault signals have to be calculated by using means and standard deviations of fault and blank signals 304. These steps have to be repeated by increasing the standard deviation of the noise 306 in order to make blank signal threshold higher and fault signal threshold lower 305. For a particular standard deviation of the noise, blanks signal threshold will be lower than fault signal threshold. It implies that the probability of false alarm will be no longer zero. Hence, the fault signal threshold from previous iteration can be used for fault detection as a threshold for decision. After defining threshold value for decision in threshold determination step 201, it can be used in the Fault Detection step 204.

Threshold determination step 201 can be imagined as a preparation step to define the thresholds for all algorithms in advance. They are determined by using fault cables.

After determination 201 of threshold values, fault detection 204, classification 205 and localization 206, 207 algorithms can be started with a pretest analysis 208. In this step 208, the variance of the received data calculated in order to decide whether the received data is too much noisy or not by and comparing with the pretest threshold value. If the calculated variance value is higher than predefined threshold value, it means that channel has so much noise and process has to be terminated. If not, the algorithms can be started.

Fault Detection 204 and Fault Classification 205 algorithms have to be run in hybrid on 202 mode, fault localization algorithms 206, 207 have to be run in hybrid off 203 mode. For this reason, firstly hybrid on 202 and hybrid off 203 modes will be explained next.

In hybrid on mode 202, a pulse with a particular duration is transmitted to the cable and reflections from the cable are recorded after the transmitted signal is subtracted from the line signal by an echo canceller. It means that, only reflected signal has to be recorded in this mode. On the other hand, the receiver records the cable response including the transmitted pulse in hybrid off mode 203.

FIG. 4 shows a flow diagram of the step for detecting 204 a fault of the ethernet cable 101.

In order to detect the faults on the cable, matched filter 401 will be used. The final decision about faulty is made at the output matched filter by comparing the magnitude against the decision threshold which is defined in pretest analysis 201 step. After matched filter operations, there is a comparison step 402. There can be two different decisions such as nonfaulty or faulty cable. If the magnitude of matched filter output is higher than predefined threshold value, it means that there is a fault on the cable and if it is smaller than threshold value, it means that cable is non faulty. In this step 402 we cannot decide about the faulty types whether it is open or short.

FIG. 5 shows a flow diagram of the step of classifying 205 the type of fault, i.e. open or short.

After detecting the fault, classification algorithm 205 has to be taken place. There can be two different options as an output of classification 205 such as open cable and short cable. There is a comparison block 501 in the algorithm to decide the class. If the output of matched filter is positive, it means that the cable is open. If not, the cable has to be short. The classification 205 is very important since localization algorithm 206, 207 depends on the fault type. For this reason, classification step 205 cannot be disregarded.

FIG. 6 shows a flow diagram of the localization 206, 207 of the detected 204 and classified 205 fault. FIG. 7 shows a signal diagram used for fault localization of a fault of the open type and FIG. 8 shows a signal diagram used for fault localization of a fault of the short type.

The localization algorithm was developed by using Time Domain Reflectometry concept along with matched filter based on the observations from experiments. The most important thing is disabling 203 the hybrid circuit 105. Since there is no synchronization between transmitter 102 and receiver 103. With the help of hybrid off mode, the data which is sampled consists information of both transmitted and reflected signal. So, the fault location can be estimated by determining the interval between transmitted and reflected signal. The fault location is estimated using the matched filter output. The algorithm is started when the received signal magnitude is higher than predefined threshold value (it can be seen in FIG. 7 and FIG. 8 as a dashed lines) and from that time data should be recorded. It is called for example first rising time (S). Then first peak should be detected, and that time is marked as first peak time (P1). After detecting the first peak, the magnitude is going down and when it is lower than predefined threshold value, that time is marked first falling time (F1). Then there are two different options to choose in terms of fault type. If fault is open, the algorithm should find the second peak by using the same threshold value. However, if the fault type is short, algorithm has to use negative threshold value because of the reflected signal's negative magnitude. In both types, index of second peak has to be identified and it is named second peak time (P2). Finally, after second peak is detected the value starts decreasing and once the value is below the threshold value, that time is market the last falling time (L). If two peaks detected in both fault types, it means that the reflected signal due to the fault and transmitted signal are separated from each other and open or short faults occurs at far end location. Fault location can be estimated by determining the interval between two peaks (P2−P1). Nevertheless, if interval between two peak indexes is lower than pulse width (PW), location can be estimated by using last and first recorded index (L−S−2×PW+1). It means that the reflected signal due to fault and transmitted signal are adjacent/close to each other. If just one peak is detected, it means that the reflected signal due to fault and transmitted signal overlap on each other. And the location of fault is near end of the cable. The location can be estimated as similar as adjacent scenario. Finally, if any peak cannot be detected, it means the fault location is directly assigned to zero.

LIST OF REFERENCE NUMERALS 100 ethernet physical device
101 ethernet physical cable
102 transmitter circuit
103 receiver circuit
104 clock generator
105 hybrid circuit
106 pulse generator
107 analog-to-digital converter (ADC)
108 diagnostic controller
109 symbol storage memory
110 media port
200 method for detecting, classifying and localizing cable faults of an ethernet physical cable
201 threshold determination
202 switch hybrid on
203 switch hybrid off
204 fault detection
205 fault classification
206 fault localization (short)
207 fault localization (open)
208 pretest analysis
301 sampling data (terminated case)
302 sampling data (faulty case)
303 adding random noise
304 calculating threshold values
305 compare threshold values
306 increase standard deviation of noise
401 matched filter
402 comparison (fault detection)
501 comparison (fault classification)

The invention claimed is:

1. A method for detecting, classifying and localizing cable faults of an ethernet physical cable, particularly an automotive ethernet PHY, using a time domain reflectometry algorithm, comprising the steps:

sending through a transmitter a first finite duration diagnosis pulse signal to the ethernet cable, receiving by a receiver first reflections from the ethernet cable in response to the first diagnosis pulse signal, extracting a first reflected signal by subtracting the send first diagnosis pulse signal from the received first reflections, detecting a fault of the ethernet cable by comparing the first reflected signal to a predetermined threshold, wherein a fault of the ethernet cable is detected when the first reflected signal exceeds the predetermined threshold, classifying the type of fault of the detected fault based on the polarity of the first reflected signal, wherein the fault is an open when the first reflected signal is positive and a short when the first reflected signal is negative, sending through the transmitter a second finite duration diagnosis pulse signal to the ethernet cable, receiving by the receiver second reflections from the ethernet cable in response to the second diagnosis pulse signal, extracting a second reflected signal comprising the send second diagnosis pulse signal and the received second reflections, detecting a first peak in the second reflected signal relating to the send second diagnosis pulse and a second peak in the second reflected signal relating to the received second reflection, and localizing the detected fault of the ethernet cable by determining the time difference between the detected first peak and the detected second peak.

2. The method for detecting, classifying and localizing cable faults of an ethernet physical cable according to claim 1, wherein the transmitter and the receiver are clocked by different clock signals from one clock generator.

3. The method for detecting, classifying and localizing cable faults of an ethernet physical cable according to claim 1, wherein a matched filtering is used for generating a filter response as an input for comparing with the predetermined threshold.

4. The method for detecting, classifying and localizing cable faults of an ethernet physical cable according to claim 1, wherein the predetermined threshold is defined by experiments.

5. The method for detecting, classifying and localizing cable faults of an ethernet physical cable according to claim 4, wherein the experiments refer to different fault types and/or different cables length.

6. The method for detecting, classifying and localizing cable faults of an ethernet physical cable according to claim 4, wherein the experiments also consider data of a non-faulty ethernet cable and/or random noise.

7. The method for detecting, classifying and localizing cable faults of an ethernet physical cable according to claim 1, further comprising the step of performing a pretest analysis of the ethernet link for detecting if the present noise level on the ethernet channel is above a given threshold.

8. The method for detecting, classifying and localizing cable faults of an ethernet physical cable according to claim 1, wherein the step of detecting a first peak in the second reflected signal relating to the send second diagnosis pulse and a second peak in the second reflected signal relating to the received second reflection bases on the predefined threshold value of the fault detection step to detect the first peak and the second peak.

9. The method for detecting, classifying and localizing cable faults of an ethernet physical cable according to claim 8, wherein predetermined threshold value for detecting the first peak is positive and for detecting the second peak the threshold value is positive for an open fault and negative for a short fault.

10. The method for detecting, classifying and localizing cable faults of an ethernet physical cable according to claim 1, wherein the method is implemented in software of an ethernet controller.

11. An ethernet physical layer device capable of detecting, classifying and localizing cable faults of an ethernet physical cable using a time domain reflectometry algorithm comprising:

a media port for connecting to the ethernet physical cable, a transmitter circuit for transmitting signals over the ethernet physical cable, a receiver circuit for receiving signals from the ethernet physical cable, a clock generator for providing different clock signals to the transmitter circuit and receiver circuit, wherein the different clock signals preferably have the same frequency and different phases, a hybrid circuit for subtracting send transmitter signals from received receiver signals, wherein the hybrid circuit can be switched on and off, a programmable pulse generator for generating a first finite duration diagnosis pulse and/or a second finite duration diagnosis pulse, and an ethernet physical cable diagnostic controller for implementing the method according to claim 1.

12. The ethernet physical layer device according to claim 11, wherein the receiver circuit comprises an analog-to-digital converter for converting the received receiver signals to the digital domain.

13. The ethernet physical layer device according to claim 11, wherein the clock generator generates clock signals a frequency corresponding to the baud rate of the ethernet physical layer device.

14. The ethernet physical layer device according to claim 11, further comprising a memory for storing received receiver signals.

15. The ethernet physical layer device according to claim 14, wherein the memory corresponds to existing data registers used during data transfer via the ethernet physical cable.

16. The method for detecting, classifying and localizing cable faults of an ethernet physical cable according to claim 2, wherein a matched filtering is used for generating a filter response as an input for comparing with the predetermined threshold.

17. The method for detecting, classifying and localizing cable faults of an ethernet physical cable according to claim 16, wherein the predetermined threshold is defined by experiments.

18. The method for detecting, classifying and localizing cable faults of an ethernet physical cable according to claim 17, wherein the experiments also consider data of a non-faulty ethernet cable and/or random noise.

19. The method for detecting, classifying and localizing cable faults of an ethernet physical cable according to claim 18, further comprising the step of performing a pretest analysis of the ethernet link for detecting if the present noise level on the ethernet channel is above a given threshold.

20. The method for detecting, classifying and localizing cable faults of an ethernet physical cable according to claim 19, wherein the step of detecting a first peak in the second reflected signal relating to the send second diagnosis pulse and a second peak in the second reflected signal relating to the received second reflection bases on the predefined threshold value of the fault detection step to detect the first peak and the second peak.

* * * * *